(12) United States Patent
Matsumoto et al.

(10) Patent No.: US 11,885,841 B2
(45) Date of Patent: Jan. 30, 2024

(54) ELECTRIC FIELD SENSOR

(71) Applicants: Yokogawa Electric Corporation, Tokyo (JP); Hosei University, Tokyo (JP)

(72) Inventors: Yoshinori Matsumoto, Tokyo (JP); Hiroaki Tanaka, Tokyo (JP); Jun Katsuyama, Tokyo (JP); Mitsuru Shinagawa, Tokyo (JP)

(73) Assignees: Yokogawa Electric Corporation, Musashino (JP); Hosei University, Tokyo (JP)

( * ) Notice: Subject to any disclaimer, the term of this patent is extended or adjusted under 35 U.S.C. 154(b) by 408 days.

(21) Appl. No.: 17/275,464

(22) PCT Filed: Sep. 19, 2019

(86) PCT No.: PCT/JP2019/036677
§ 371 (c)(1),
(2) Date: Mar. 11, 2021

(87) PCT Pub. No.: WO2020/066816
PCT Pub. Date: Apr. 2, 2020

(65) Prior Publication Data
US 2022/0050132 A1    Feb. 17, 2022

(30) Foreign Application Priority Data
Sep. 26, 2018   (JP) .................................. 2018-180875

(51) Int. Cl.
*G02F 1/035* (2006.01)
*G02F 1/295* (2006.01)
(Continued)

(52) U.S. Cl.
CPC ....... *G01R 29/0885* (2013.01); *G02F 1/0305* (2013.01); *G02F 1/225* (2013.01)

(58) Field of Classification Search
CPC . G01R 29/0885; G01R 35/005; G02F 1/0305; G02F 1/225; G02F 1/2255
(Continued)

(56) References Cited

U.S. PATENT DOCUMENTS 6,201,235 B1 * 3/2001 Takeuchi ............. G01R 13/347
250/214 R

FOREIGN PATENT DOCUMENTS

EP    1650574 A1    4/2006
JP    2-143173 A    6/1990
(Continued)

OTHER PUBLICATIONS

Tokio Kihara, "Measurements of Voltage by Using an Electro-Optic Crystal Sensor", Fukui University of Technology, Memoirs of Fukui University of Technology, 1987, pp. 37-45, vol. 17.
(Continued)

*Primary Examiner* — Kaveh C Kianni
*Assistant Examiner* — Hung Q Lam
(74) *Attorney, Agent, or Firm* — Sughrue Mion, PLLC

(57) ABSTRACT

An electric field sensor which measures an electric field generated by a target utilizing an electro-optic effect, the electric field sensor including a light source, an electro-optic crystal on which light in a predetermined polarization state emitted from the light source is incident and which is subjected to the electric field generated by the target, a reference electric field applicator configured to apply an electric field based on a reference signal with a known signal level to the electro-optic crystal, a light receiver configured to receive light emitted from the electro-optic crystal and to convert the received light into an electric signal, and a separation corrector configured to separate the electric signal into a measurement signal based on the electric field generated by the target and the reference signal and to correct
(Continued)

a signal level of the measurement signal on the basis of the signal level of the separated reference signal.

9 Claims, 7 Drawing Sheets

(51) Int. Cl.
    *G02B 6/12*           (2006.01)
    *G01R 29/08*        (2006.01)
    *G02F 1/03*           (2006.01)
    *G02F 1/225*        (2006.01)

(58) Field of Classification Search
    USPC .................. 385/2, 3, 8, 9, 14; 250/214 AG
    See application file for complete search history.

(56) References Cited

FOREIGN PATENT DOCUMENTS

| | | |
|---|---|---|
| JP | 7-181211 A | 7/1995 |
| JP | 11-6849 A | 1/1999 |
| JP | 2002-122622 A | 4/2002 |
| JP | 2007-101384 A | 4/2007 |

OTHER PUBLICATIONS

Xiaojun Zeng et al., "Electro-optical measurement of highly intense electric field with high frequency", Proceedings of SPIE, 2000, pp. 298-304, vol. 4082.

Hiroshi Ito et al., "Development of the Electric Field Meter Using Ti:LiNb03 Integrated Optics", R&D Review of Toyota Central R&D Labs, R&D Review Editorial Committee, 1994, pp. 13-24, vol. 29, No. 3.

Hajime Kusumi et al., "Technology for testing printed wiring boards using the E-O effect", SHM Journal, 1996, pp. 28-32, vol. 12, No. 3.

* cited by examiner

ELECTRIC FIELD SENSOR

CROSS-REFERENCE TO RELATED APPLICATIONS

This application is a National Stage of International Application No. PCT/JP2019/036677 filed Sep. 19, 2019, claiming priority based on Japanese Patent Application No. 2018-180875 filed in Japan on Sep. 26, 2018, the entire contents of each of which are incorporated by reference herein.

TECHNICAL FIELD

The present invention relates to an electric field sensor.

BACKGROUND ART

As an electric field sensor for measuring an electric field, a sensor element made of a metal such as a general dipole antenna is generally used.

On the other hand, in electric field measurement using an electro-optic effect, since a sensor element is not made of a metal, an electric field to be measured can be measured without being disturbed, and furthermore, measurement with a high spatial resolution can be performed. Therefore, electric field measurement using the electro-optic effect has begun to be used in various applications. The "electro-optic effect" is an effect in which, when an electric field is applied to an electro-optic crystal, a refractive index of light passing through the electro-optic crystal changes in proportion to an electric field intensity. A change in the refractive index causes a phase change in a light wave passing through the optical crystal. In electric field measurement using the electro-optic effect, an electric field applied to an electro-optic crystal can be measured by measuring a change in phase (see, for example, Patent Literatures 1 and 2).

An outline of a configuration and an operation of a conventional electric field sensor using the electro-optic effect will be described.

FIG. 8 is a diagram showing a configuration example of a conventional electric field sensor utilizing an electro-optic effect. As shown in FIG. 8, an electric field sensor 900 includes a light source 901, a polarizer 902, a wavelength plate 903, an electro-optic crystal 904, a polarizer 905, and a light receiver 906.

The light source 901 is, for example, a semiconductor laser. The polarizer 902 emits linearly polarized light (reference sign 911) among light beams incident from the light source 901. The wavelength plate 903 is a λ/4 wavelength plate and polarizes the light beams incident from the polarizer 902 into circularly polarized light (reference sign 912) to emit it. The electro-optic crystal 904 changes a polarization state due to a change in birefringence according to an electric field intensity applied by an external electric field source. The electro-optic crystal 904 emits a light beam of elliptically polarized light (reference sign 913) whose polarization state has changed. The polarizer 905 converts the light beam emitted by the electro-optic crystal 904 into linearly polarized light. The light receiver 906 converts the light beam emitted by the polarizer 905 into an electric signal and outputs it. The reason why the wavelength plate 903 is used is to prevent a detection sensitivity of the same birefringent component as a polarization axis of the light source from decreasing when linearly polarized light is incident on the electro-optic crystal 904, and because it is necessary to use circularly polarized light to determine a polarity of the electric field. In the configuration of FIG. 8, an electric field intensity to be measured is converted into an electric intensity by converting a change in light intensity into a light receiver electric signal (see, for example, Non-Patent Literature 1).

In the configuration of FIG. 8, a measured value may vary due to a change in an amount of light from the light source. A configuration example in which a polarization beam splitter is disposed instead of the polarizer after an output of the electro-optic crystal to reduce the variation will be described. FIG. 9 is a diagram showing a configuration example in which a polarization beam splitter is disposed instead of an analyzer (the polarizer 905) after an output of the electro-optic crystal 904. As shown in FIG. 9, an electric field sensor 900A includes a light source 901, a polarizer 902, a wavelength plate 903, an electro-optic crystal 904, a beam splitter 907, a mirror 908, a first light receiver 906a, a second light receiver 906b, and a differential amplifier 909.

The beam splitter 907 is a polarization beam splitter and separates incident light into a horizontal polarization component $P_P$ and a vertical polarization component $P_S$. For example, the first light receiver 906a converts the horizontal polarization component $P_P$ into an electric signal. The second light receiver 906b converts the vertical polarization component $P_S$ that has been totally reflected by the mirror into an electric signal. The differential amplifier 909 performs differential output of the two component signals output from the first light receiver 906a and the second light receiver 906b. With this configuration, common variation components such as light source variation are removed (see, for example, Non-Patent Literature 2).

Next, a refractive index change, an optical phase change, incident optical power, and emitted optical power of the electro-optic crystal 904 will be described.

When an external electric field E is applied to the electro-optic crystal 904, a magnitude Δn of change in a refractive index of the electro-optic crystal 904 is represented by the following expression (1).

[Math. 1]

$$\Delta n = \frac{1}{2} n^3 \cdot r_{eff} E \qquad (1)$$

In expression (1), Δn is a refractive index change, n is an unperturbed refractive index, E is an electric field intensity, and $r_{eff}$ is a linear electro-optic coefficient.

An optical phase change ΔΦ at this time is represented by the following expression (2).

[Math. 2]

$$\Delta\phi = \frac{2}{\lambda} \pi \cdot \Delta n \cdot L \cdot d = \frac{2\pi \cdot n^3 \cdot L \cdot E \cdot r_{eff}}{\lambda \cdot d} \qquad (2)$$

In expression (2), ΔΦ is a phase change, L is a crystal length, d is a crystal thickness, and λ is a wavelength.

When the wavelength plate 903 gives a phase difference of λ2 to light linearly polarized by the polarizer 902 to convert it into circularly polarized light, an optical power intensity $P_{out}$ output from the analyzer (polarizer 905) is represented by the following expression (3).

[Math. 3]

$$P_{out} = P_{in} \cdot (1 + \sin(\Delta\phi))/2 \qquad (3)$$

In expression (3), $P_{out}$ is the optical power intensity output from the analyzer (polarizer 905), and $P_{in}$ is optical power input to the electro-optic crystal.

CITATION LIST

Patent Literature

[Patent Literature 1]
Japanese Unexamined Patent Application, First Publication No. 2002-122622
[Patent Literature 2]
Japanese Unexamined Patent Application, First Publication No. 2007-101384

Non-patent Literature

[Non-Patent Literature 1]
Tokio Kihara, "Measurements of Voltage by Using an Electro-Optic Crystal Sensor", Fukui University of Technology, Memoirs of Fukui University of Technology No. 17, p 37-p 45, 1987
[Non-Patent Literature 2]
Xiaojun Zeng, Haiqing Chen, "Electro-optical measurement of highly intense electric field with high frequency," Optical Sensing, Imaging and Manipulation for Biological and Biomedical Applications Held in Taipei, Taiwan on 26-27 Jul. 2000, p 298-307
[Non-Patent Literature 3]
Hiroshi Ito, Tadashi Ichikawa, "Development of Electric Field Meter Using Ti:LiNbO3 Integrated Optics," R&D Review of Toyota Central R&D Labs, R&D Review Editorial Committee, Vol. 29 No. 3, 1994 Sep., p13-24
[Non-Patent Literature 4]
Hajime Kuzumi, Masayuki Yoshima, Eiji Konishi, "Technology for Testing Printed Wiring Boards Using E-O Effect, " SMH Journal, Vol. 12, (1996) No. 3, p. 28-32

SUMMARY OF INVENTION

Technical Problem

A magnitude of an amount of phase change with respect to an electric field of an optical crystal, that is, a linear electro-optic constant $r_{eff}$ corresponding to a sensitivity, changes according to a temperature dependence of birefringence of the optical crystal. Further, a phase change is added to the linear electro-optic constant $r_{eff}$ due to a change in a polarized wave state in the crystal caused by stress such as extension and contraction of an electro-optical action length of the crystal due to a thermal expansion coefficient of a material of the optical crystal, and thereby a sensor output varies due to factors other than an electric field to be measured, and the variation amount is added to an original measurement output, resulting in a decrease in measurement stability.

It is known that natural birefringence of an optical crystal changes due to a temperature variation. For example, when a wavelength of a light source changes due to a temperature, an amount of phase shift due to a λ/4 wavelength plate is changed. Since an optical crystal has an in-plane distribution of an electro-optic constant and a position of a light beam passing through the crystal shifts due to a change in ambient temperature, a change in sensitivity with respect to an electric field intensity is also a variation factor of a sensitivity to the electric field intensity. Since light entering an electro-optic crystal changes from circularly polarized light to elliptically polarized light due to a temperature dependence of components used for guiding light into a sensor such as a λ/4 wavelength plate or polarization-maintaining fibers, a decrease in detection sensitivity is also a variation factor of the sensitivity to the electric field intensity. Further, since a polarization beam splitter also has temperature dependence, a ratio between a P-wave component and an S-wave component that are separated changes.

Due to these variation factors, even when branching is performed at a polarization beam splitter to configure a differential optical system so that a temporal variation in intensity of a light source is cancelled as in the technology described in Non-Patent Literature 2, it is not easy to cancel the temperature-dependent factors of the entire sensor and perform highly stable electric field measurement.

One aspect of the present invention provides an electric field sensor that utilizes an electro-optic effect and can measure an electric field intensity without impairing measurement stability even when an ambient temperature or the like changes.

Solution to Problem

An electric field sensor (100, 100A, 100A', 100C, 100D) according to one aspect of the present invention is an electric field sensor which measures an electric field generated by a target utilizing an electro-optic effect and includes a light source (1), an electro-optic crystal (5, 5D) on which light in a predetermined polarization state emitted from the light source is incident and which is subjected to an electric field generated by the target, a reference electric field applicator (reference power supply 11, electric field controller 15, reference electric field source 16) configured to apply an electric field based on a reference signal with a known signal level to the electro-optic crystal, a light receiver (1021) configured to receive light emitted from the electro-optic crystal and to convert the received light into an electric signal, and a separation corrector (1022, 1022A) configured to separate the electric signal into a measurement signal based on the electric field generated by the target and the reference signal and to correct a signal level of the measurement signal on the basis of the signal level of the separated reference signal.

With the configuration described above, the electric field sensor can monitor an amount of change in a linear electro-optic constant $r_{eff}$ by applying an electric field based on the reference signal with a known signal level to the electro-optic crystal and detecting a change in the linear electro-optic constant $r_{eff}$ only with the reference signal at a second separator. When a signal level of the measurement signal is corrected on the basis of the signal level of the reference signal detected as described above, the electric field sensor utilizes an electro-optic effect and can measure the electric field intensity without impairing measurement stability even when an ambient temperature or the like changes.

In the electric field sensor according to one aspect of the present invention, the separation corrector may include a first separator (a filter 10) configured to separate the measurement signal from the electric signal, a second separator (a lock-in amplifier 12) configured to separate the reference signal from the electric signal, and a corrector (a gain controller 13, a variable gain amplifier 14) configured to correct the signal level of the measurement signal on the basis of the signal level of the separated reference signal.

With the configuration described above, the electric field sensor can obtain the amount of phase change induced by the electric field intensity applied to the electro-optic crystal.

With the configuration described above, it is possible to provide an electric field sensor with high measurement stability by correcting a phase change using the separation corrector that constantly monitors the phase change.

The electric field sensor according to one aspect of the present invention may further include a measurement electric field applicator (measurement power supply 21, measurement electric field controller 22) configured to apply a referential signal with a known signal level to the target, and the separation corrector may include a first separator (lock-in amplifier 12a) configured to separate the measurement signal on which the referential signal is superimposed from the electric signal, a second separator (lock-in amplifier 12b) configured to separate the reference signal from the electric signal, and a corrector (gain controller 13, variable gain amplifier 14) configured to correct the signal level of the measurement signal on the basis of the signal level of the separated reference signal.

With the configuration described above, the electric field sensor is configured such that the referential signal is superimposed on the measurement signal by applying the electric field based on the referential signal to the electric field generated by the target, and the first separator separates the measurement signal on which the referential signal is superimposed from the electric signal. Thereby, for example, when there is capacitive coupling noise from the power supply or noise due to electromagnetic induction or the like in the surroundings in addition to the electric field to be measured, the electric field sensor can remove these noise components with the above-described configuration. As a result, the electric field sensor can measure the electric field intensity with high accuracy even when an electric field intensity to be measured is small and a signal to noise (SN) ratio is poor.

In the electric field sensor according to one aspect of the present invention, the target may be a solar cell (201), the light source (solar cell irradiation light source 24) may be configured to irradiate the solar cell with light, and the electro-optic crystal may be subjected to an electric field generated by the solar cell irradiated with the light from the light source as an electric field generated by the target.

With the configuration described above, the electric field sensor can measure the electric field generated by irradiating the solar cell with light. Thereby, with the configuration described above, since an electric field sensitivity of the electric field sensor can be corrected using the reference signal even when an ambient temperature changes, highly stable measurement is possible.

In the electric field sensor according to one aspect of the present invention, the electro-optic crystal may include a first optical waveguide (3031) on which light of the light source is incident, a first electrode (3033) which is connected to a first output of the first optical waveguide and to which the electric field generated by the target is input, a second electrode (3034) which is connected to the first electrode and to which the electric field based on the reference signal is applied, a third electrode (3032) connected to a first output of the first optical waveguide and grounded, and a second optical waveguide (3035) having a first input to which the second electrode is connected, a second input to which the third electrode is connected, and an output connected to the light receiver.

With the configuration described above, the electric field sensor can monitor a phase change with respect to a temperature change by applying the electric field based on the reference signal even in the electric field sensor of an optical waveguide-type. With the configuration described above, it is possible to provide an electric field sensor with high measurement stability by correcting a phase change using the separation corrector that constantly monitors the phase change.

The electric field sensor according to one aspect of the present invention may further include a transparent electrode (ITO electrode 5D1) disposed on a first surface of the electro-optic crystal (5D), and a mirror (5D2) disposed on a second surface of the electro-optic crystal facing the first surface, light emitted from the light source may be incident from the transparent electrode, the light incident from the transparent electrode may be reflected by the mirror, and the reflected light may be emitted from the transparent electrode.

With the configuration described above, the electric field sensor measures an electric field intensity by acquiring a phase change of light when a light beam is reflected by the mirror and returned through the transparent electrode. With the configuration described above, the electric field sensor can monitor a phase change with respect to a temperature change by applying the electric field based on the reference even when a phase change occurs with respect to the electric field applied to the transparent electrode and a lower surface of the crystal. With the configuration described above, it is possible to provide an electric field sensor with high measurement stability by correcting a phase change using the separation corrector that constantly monitors the phase change.

In the electric field sensor according to one aspect of the present invention, the predetermined polarization state may be circularly polarized light.

With the configuration described above, the electric field sensor can determine a polarity of the electric field using the circularly polarized light.

In the electric field sensor according to one aspect of the present invention, a frequency of the reference signal may be in a frequency band that does not affect the measurement signal.

With the configuration described above, since the electric field sensor is configured such that the reference signal intensity does not affect the measurement signal, it is possible to provide an electric field sensor with high measurement stability.

In the electric field sensor according to one aspect of the present invention, the light receiver may include a polarization beam splitter configured to separate circularly polarized light emitted from the electro-optic crystal into P-polarized light and S-polarized light, and a differential amplifier configured to amplify a differential component of electric signals of the P-polarized light and the S-polarized light separated by the polarization beam splitter and to output the amplified electric signal to the separation corrector.

With the configuration described above, when a signal level of the measurement signal is corrected on the basis of the signal level of the reference signal detected as described above, the electric field sensor utilizes an electro-optic effect and can measure the electric field intensity without impairing measurement stability even when an ambient temperature or the like changes.

In the electric field sensor according to one aspect of the present invention, the separation corrector may include a filter configured to remove a signal component of the electric field based on the reference signal in the electric signal output from the differential amplifier, an amplifier configured to extract a signal component of the electric field based on the reference signal in the electric signal output from the differential amplifier using the reference signal, a gain controller configured to generate a control signal that controls an amplification factor according to the signal component of the electric field based on the reference signal output from the amplifier, and a variable gain amplifier configured to vary an amplification factor of the electric signal output from the filter in which the signal component of the electric field based on the reference signal is removed according to the control signal output from the gain controller, and to output the electric signal.

With the configuration described above, when a signal level of the measurement signal is corrected on the basis of the signal level of the reference signal detected as described above, the electric field sensor utilizes an electro-optic effect and can measure the electric field intensity without impairing measurement stability even when an ambient temperature or the like changes.

The electric field sensor according to one aspect of the present invention may further include a measurement electric field applicator configured to apply a referential signal with a known signal level to the target, and the light receiver may include a polarization beam splitter configured to separate circularly polarized light emitted from the electro-optic crystal into P-polarized light and S-polarized light, and a differential amplifier configured to amplify a differential component of electric signals of the P-polarized light and the S-polarized light separated by the polarization beam splitter and to output the amplified electric signal to the separation corrector.

With the configuration described above, when there is capacitive coupling noise from the power supply or noise due to electromagnetic induction or the like in the surroundings in addition to the electric field to be measured, the electric field sensor can remove these noise components with the above-described configuration. As a result, the electric field sensor can measure the electric field intensity with high accuracy even when an electric field intensity to be measured is small and the SN ratio is poor.

In the electric field sensor according to one aspect of the present invention, the separation corrector may include a first amplifier configured to extract a signal component of an electric field based on the measurement signal in an electric signal output from the differential amplifier using the measurement signal, a second amplifier configured to extract a signal component of an electric field based on the reference signal in an electric signal output from the differential amplifier using the reference signal, a gain controller configured to generate a control signal that controls an amplification factor according to a signal component of the electric field based on the reference signal output from the second amplifier, and a variable gain amplifier configured to vary an amplification factor of the electric signal of the signal component of the electric field based on the measurement signal output from the first amplifier according to the control signal output from the gain controller, and to output the electric signal.

With the configuration described above, when there is capacitive coupling noise from the power supply or noise due to electromagnetic induction or the like in the surroundings in addition to the electric field to be measured, the electric field sensor can remove these noise components with the above-described configuration. As a result, the electric field sensor can measure the electric field intensity with high accuracy even when an electric field intensity to be measured is small and the SN ratio is poor.

In the electric field sensor according to one aspect of the present invention, the separation corrector may be configured to measure the electric field generated by the target by acquiring a phase change of light that has been emitted by the light source, reflected by the mirror, and returned through the transparent electrode.

With the configuration described above, the electric field sensor can monitor a phase change with respect to a temperature change by applying the electric field based on the reference even when a phase change occurs with respect to the electric field applied to the transparent electrode and a lower surface of the crystal.

In the electric field sensor according to one aspect of the present invention, the light receiver may include a polarization beam splitter configured to separate circularly polarized light emitted from the electro-optic crystal into P-polarized light and S-polarized light, and a differential amplifier configured to amplify a differential component of electric signals of the P-polarized light and the S-polarized light separated by the polarization beam splitter and to output the amplified electric signal to the separation corrector.

With the configuration described above, it is possible to provide an electric field sensor with high measurement stability by correcting a phase change using the separation corrector that constantly monitors the phase change.

In the electric field sensor according to one aspect of the present invention, the separation corrector may include a filter configured to remove a signal component of the electric field based on the reference signal in the electric signal output from the differential amplifier, an amplifier configured to extract a signal component of the electric field based on the reference signal in the electric signal output from the differential amplifier using the reference signal, a gain controller configured to generate a control signal that controls an amplification factor according to the signal component of the electric field based on the reference signal output from the amplifier, and a variable gain amplifier configured to vary an amplification factor of the electric signal output from the filter in which the signal component of the electric field based on the reference signal is removed according to the control signal output from the gain controller, and to output the electric signal.

With the configuration described above, it is possible to provide an electric field sensor with high measurement stability by correcting a phase change using the separation corrector that constantly monitors the phase change.

Advantageous Effects of Invention

According to one aspect of the present invention, an electric field intensity can be measured without impairing measurement stability even when an ambient temperature or the like changes in an electric field sensor that utilizes an electro-optic effect.

DESCRIPTION OF EMBODIMENTS

Figure 1:
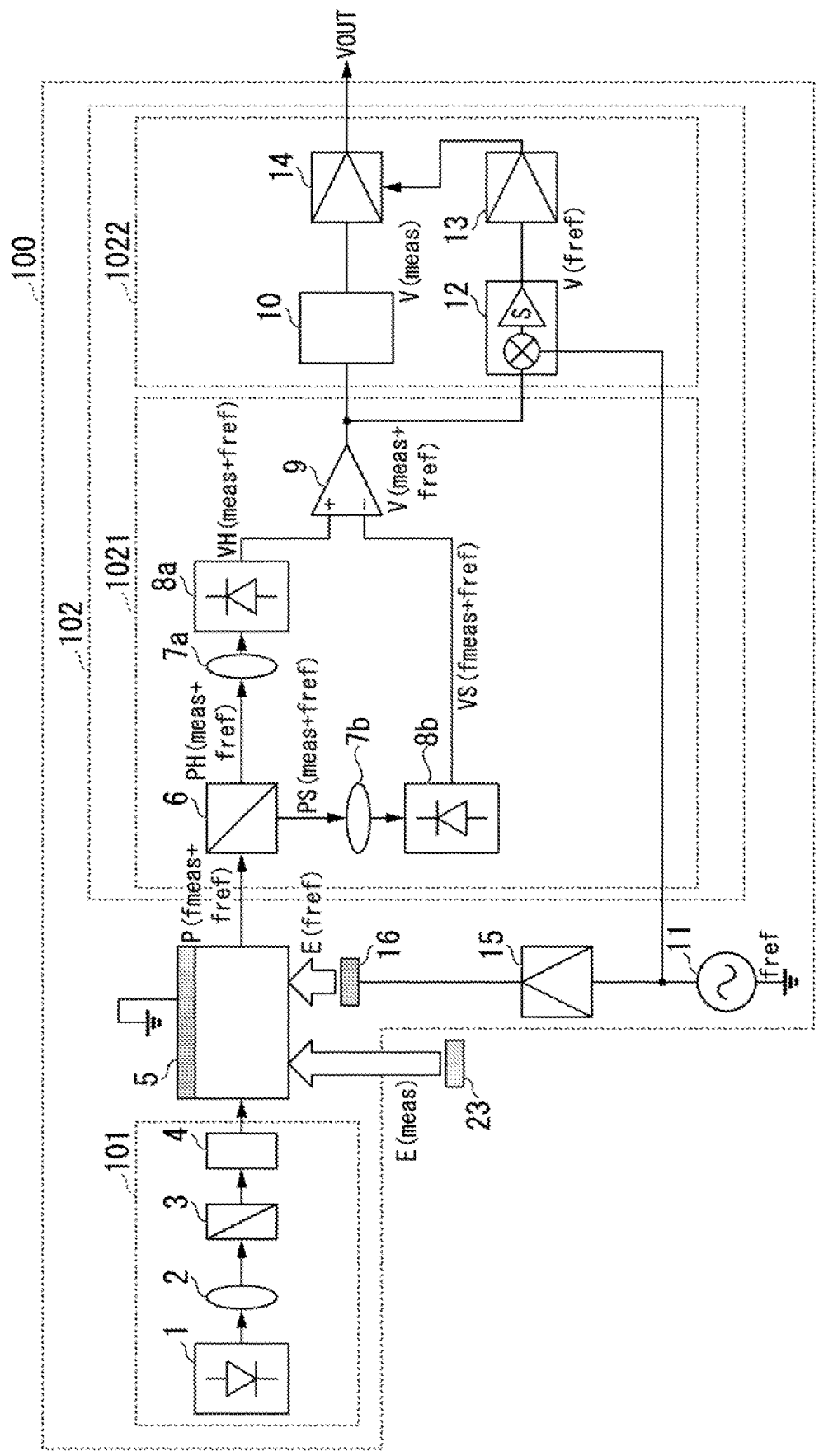
FIG. 1 is a diagram showing a configuration example of an electric field sensor according to a first embodiment.

Hereinafter, embodiments of the present invention will be described with reference to the drawings. In the drawings used in the following description, a scale of each member will be appropriately changed so that a size of each member is recognizable.

First Embodiment

FIG. 1 is a diagram showing a configuration example of an electric field sensor 100 according to the present embodiment.

As shown in FIG. 1, the electric field sensor 100 includes a light source 1, a lens 2, a polarizer 3, a λ/4 wavelength plate 4, an electro-optic crystal 5, a polarization beam splitter 6 (light receiving means, light receiver), a lens 7a (light receiving means, light receiver), a lens 7b (light receiving means, light receiver), a light receiver 8a (light receiving means, light receiver), a light receiver 8b (light receiving means, light receiver), a differential amplifier 9 (light receiving means, light receiver), a filter 10 (first separator), a reference power supply 11 (reference electric field means, reference electric field applicator), a lock-in amplifier 12 (second separator), a gain controller 13, a variable gain amplifier 14, an electric field controller 15 (reference electric field means, reference electric field applicator), and a reference electric field source 16 (reference electric field means, reference electric field applicator).

A component 101 on an input side to the electro-optic crystal 5 includes the light source 1, the lens 2, the polarizer 3, and the λ/4 wavelength plate 4.

A component 102 (separation correction means, separation corrector) on an output side of the electro-optic crystal 5 includes the polarization beam splitter 6, the lens 7a, the lens 7b, the light receiver 8a, the light receiver 8b, the differential amplifier 9, the filter 10, the lock-in amplifier 12, the gain controller 13 (corrector), and the variable gain amplifier 14 (corrector).

The component 102 on the output side of the electro-optic crystal 5 includes a light receiving means 1021 and a separation correction means 1022.

The light receiving means 1021 includes the polarization beam splitter 6, the lens 7a, the lens 7b, the light receiver 8a, the light receiver 8b, and the differential amplifier 9.

The separation correction means 1022 includes the filter 10, the lock-in amplifier 12, the gain controller 13, and the variable gain amplifier 14.

First, a disposition of optical components of the electric field sensor 100 will be described.

The lens 2 is disposed between the light source 1 and the polarizer 3. The polarizer 3 is disposed between the lens 2 and the λ/4 wavelength plate 4. The λ/4 wavelength plate 4 is disposed between the polarizer 3 and the electro-optic crystal 5. The electro-optic crystal 5 is disposed between the λ/4 wavelength plate 4 and the polarization beam splitter 6. The polarization beam splitter 6 is disposed between the electro-optic crystal 5 and the lens 7a, and between the electro-optic crystal 5 and the lens 7b. The lens 7a is disposed between the polarization beam splitter 6 and the light receiver 8a (light receiving element). The lens 7b is disposed between the polarization beam splitter 6 and the light receiver 8b (light receiving element). The light receiver 8a is disposed on an emission side of the lens 7a. The light receiver 8b is disposed on an emission side of the lens 7b.

Next, a connection relationship of electrical components of the electric field sensor 100 will be described.

An output terminal of the light receiver 8a is connected to a first input terminal of the differential amplifier 9. An output terminal of the light receiver 8b is connected to a second input terminal of the differential amplifier 9. An output terminal of the differential amplifier 9 is connected to an input terminal of the filter 10 and a first input terminal of the lock-in amplifier 12. An output terminal of the filter 10 is connected to an input terminal of the variable gain amplifier 14. In the lock-in amplifier 12, a second input terminal is connected to one end of the reference power supply 11 and an input terminal of the electric field controller 15, and an output terminal is connected to an input terminal of the gain controller 13. The other end of the reference power supply 11 is grounded. An output terminal of the gain controller 13 is connected to a control terminal of the variable gain amplifier 14. An output terminal of the variable gain amplifier 14 is connected to an output of the electric field sensor 100. The other end of the electric field controller 15 is connected to the reference electric field source 16. In the electro-optic crystal 5, the reference electric field source 16 is provided on a first surface side, and a second surface side facing the first surface is grounded.

Next, an operation of the electric field sensor 100 and each component thereof will be described.

The electric field sensor 100 measures an intensity of an electric field generated by a target. In FIG. 1, a measurement electric field source 23 is the target to be measured.

The light source 1 is, for example, a laser diode (LD).

The lens 2 is a collimator lens, which converts a light beam emitted by the light source into parallel light and emits it.

The polarizer 3 polarizes the light beam emitted by the lens 2 into linear light.

The λ/4 wavelength plate 4 polarizes the light beam emitted by the polarizer 3 into circularly polarized light and emits it. In the present embodiment, the λ/4 wavelength plate 4 is inserted in front of the electro-optic crystal 5 for polarization for the purpose of increasing a sensitivity near an origin of the electric field and for determining a polarity of the electric field. However, when it is not necessary to increase a sensitivity or determine a polarity of the electric field, the λ/4 wavelength plate 4 may not necessarily be mounted.

A light beam emitted by the the λ/4 wavelength plate 4 is incident on the electro-optic crystal 5, and the electro-optic crystal 5 to which a reference electric field E(fref) is applied by the reference electric field source 16 is subjected to a measurement electric field E(meas) by the measurement electric field source 23 on the same surface as the surface to which the reference electric field E(fref) is applied. The electro-optic crystal 5 emits a light beam P (meas+fref) of circularly polarized light whose polarization state has changed due to a change in birefringence according to the reference electric field E(fref) and the measurement electric field E(meas). The electro-optic crystal 5 may be, for example, LiNbO$_3$, LiTaO$_3$, Bi$_{12}$SiO$_{20}$ (BSO), Bi$_{12}$GeO$_{20}$ (BGO), ADP, KDP, a crystal, or the like.

The polarization beam splitter 6 separates the light beam of circularly polarized light emitted by the electro-optic crystal 5 into P-polarized light PH (meas+fref) and S-polarized light PS (meas+fref).

The lens 7a is a collimator lens and focuses the light beam of the P-polarized light emitted by the polarization beam splitter 6 on the light receiver 8a.

The lens 7b is a collimator lens and focuses the light beam of the S-polarized light emitted by the polarization beam splitter 6 on the light receiver 8b.

The light receiver 8a photoelectrically converts an amount of received light and outputs it to the differential amplifier 9 as an electric signal VH (meas+fref) according to an electric field intensity.

The light receiver 8b photoelectrically converts an amount of received light and outputs it to the differential amplifier 9 as an electric signal VS (meas+fref) according to an electric field intensity.

The differential amplifier 9 amplifies a differential component of electric signals of the P polarized light component and the S polarized light component, and outputs an amplified electric signal V(meas+ref) to the input terminal of the filter 10 and the lock-in amplifier 12.

The filter 10 outputs to the variable gain amplifier 14 an electric signal V(meas) from which a reference electric field signal component in a measurement signal output from the differential amplifier 9 is removed.

The reference power supply 11 generates a reference signal fief for creating the reference electric field signal component and outputs the generated reference signal to the lock-in amplifier 12 and the electric field controller 15.

The lock-in amplifier 12 extracts the reference electric field signal component V(fref) from the electric signal output from the differential amplifier 9 using the reference signal output from the reference power supply 11. For the extraction of the reference electric field signal component, the lock-in amplifier 12 may not necessarily be used, and a synchronous detection type amplifier may also be used.

The gain controller 13 generates a control signal that controls an amplification factor according to the reference electric field signal component output from the lock-in amplifier 12, and outputs the generated control signal to the variable gain amplifier 14. For example, when a magnitude of a known reference electric field signal has decreased (sensitivity has decreased), the gain controller 13 outputs a control signal for increasing a gain of the variable gain amplifier 14 to the variable gain amplifier 14. As described above, the gain controller 13 functions as an automatic gain control (AGC; automatic gain control).

The variable gain amplifier 14 varies an amplification factor of the signal output from the filter 10 according to the control signal output from the gain controller 13 and outputs the signal.

The electric field controller 15 is a driver that drives the reference signal output from the reference power supply 11 to the electric field intensity, and outputs a drive signal to the reference electric field source 16.

The reference electric field source 16 is a reference electric field source for monitoring a change in an electro-optic constant of the electro-optic crystal 5, is driven by the drive signal output from the electric field controller 15, and applies the reference electric field E(fref) to the electro-optic crystal 5. Applying the reference electric field E(fref) to the electro-optic crystal 5 as described above means that modulation is performed with the reference signal fref.

In the configuration shown in FIG. 1, although improvement in measurement stability is performed by hardware by adjusting a gain in accordance with a variation amount of the reference signal using the variable gain amplifier, this may also be calculated and processed by software after outputs of the measurement signal component and the reference signal component are analog/digital (A/D)—converted into numerical values.

Next, effects of the electric field sensor 100 will be described.

The electric field sensor 100 obtains an amount of phase change induced by the electric field intensity applied to the electro-optic crystal 5 mounted in the sensor by an optical means. A magnitude of an amount of phase change with respect to the electric field of the electro-optic crystal 5, that is, a linear electro-optic constant $r_{eff}$ corresponding to a sensitivity, changes according to a temperature dependence of birefringence of the optical crystal.

Further, an optical action length of the electro-optic crystal 5 changes according to a thermal expansion coefficient of a material of the optical crystal. Since a phase change due to a change in a polarized wave state in the crystal caused by stress is added, it is necessary to provide an electric field sensor with high measurement stability by incorporating a mechanism for constantly monitoring the phase change and correcting the change.

Therefore, in the present embodiment, an amount of change in the linear electro-optic constant $r_{eff}$ can be monitored by applying the reference electric field signal E(fref) that generates a known electric field to the electro-optic crystal and detecting a change in the linear electro-optic constant $r_{eff}$ only with the reference signal component V(fref) in the subsequent stage at the lock-in amplifier 12.

Since the signal of the reference signal component V(fref) is common from the light source to the input of the differential amplifier, when a sensitivity of the measurement signal is corrected by a calculator (the filter 10, the lock-in amplifier 12, the gain controller 13, the variable gain amplifier 14) according to an amount of variation, the electric field can be measured with high measurement stability even when the linear electro-optic constant $r_{eff}$ changes due to an ambient temperature or the like.

Figure 2:
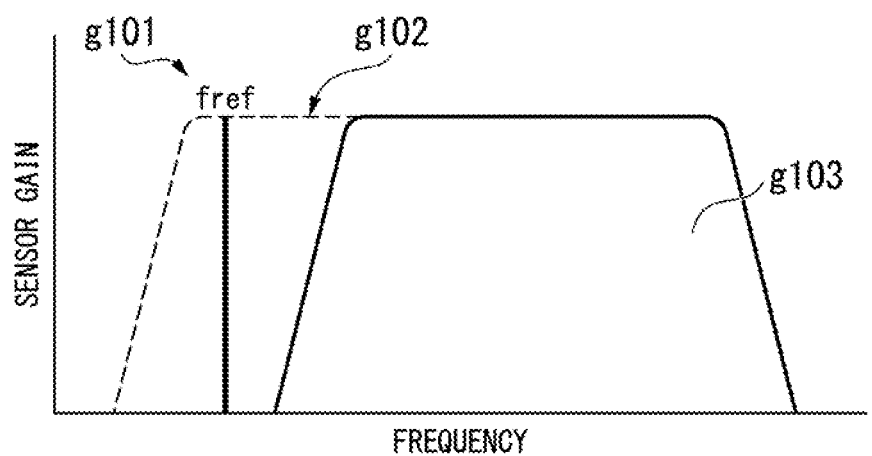
FIG. 2 is a diagram for explaining effects of the electric field sensor according to the first embodiment.

As shown in FIG. 2, a frequency of the reference signal component V(fref) and a measurement frequency band need to be separated so that an intensity of the reference signal does not affect the measurement signal. Therefore, in the present embodiment, the filter 10 is used to separate them so that an intensity of the reference signal does not affect the measurement signal.

FIG. 2 is a diagram for explaining effects of the electric field sensor 100 according to the present embodiment. In FIG. 2, the horizontal axis represents a frequency and the vertical axis represents a sensor gain of the electric field sensor 100. Reference sign g101 indicates a frequency fref of the reference signal, reference sign g102 indicates frequency characteristics of the electric field sensor 100, and reference sign g103 indicates measurement frequency characteristics. The frequency fref is, for example, 10 Hz, and the measurement frequency is, for example, 100 Hz. The frequency of the reference signal component V(fref) need only be a frequency that does not affect the measurement frequency band, and may be a lower frequency or a higher frequency than the measurement frequency band as shown in FIG. 2.

With the configuration described above, in the present embodiment, a temperature variation or the like of each component in the electric field sensor 100 is corrected by applying the reference electric field to the electro-optic crystal 5, extracting the applied reference electric field, and performing AGC for the sensitivity of the signal to be measured using the gain controller 13. As described above, in the present embodiment, a reference electric field having a known magnitude of the electric field is applied to the electro-optic crystal 5 during the measurement. In a conventional technology, since each component has temperature dependence, there have been cases in which a measured value is changed due to a temperature even though the true measured value is not changed. In contrast, in the present embodiment, an influence of the temperature dependence is corrected by taking a difference from the reference electric field with a magnitude of the known reference electric field as a reference without a change in magnitude of the electric field due to a temperature.

Thereby, in the present embodiment, the measurement electric field signal E(meas) and the reference electric field signal E(fref) for monitoring an amount of change in the linear electro-optic constant $r_{eff}$ are applied to the same electro-optic crystal, and a light beam that probes a phase change of the electro-optic crystal is also the same. Then, in the present embodiment, a measurement electric field signal component fin and a reference electric field signal fief are superimposed on a horizontal polarization component signal and a vertical polarization component signal in the polarization beam splitter 6. Thereby, according to the present embodiment, a difference in sensitivity between the two light receivers (8a and 8b) and a change in a polarization separation ratio of the polarization beam splitter 6 can also be removed by the differential amplifier 9 and the calculator (the filter 10, the lock-in amplifier 12, the gain controller 13, the variable gain amplifier 14) in the subsequent stage.

Further, in the present embodiment, the reference signal is extracted by the lock-in amplifier 12, and a signal corresponding to a required gain is generated by the gain controller 13. As described above, in the present embodiment, the gain of the variable gain amplifier 14 is actively adjusted to a gain that corrects a variation of the electro-optic constant $r_{eff}$, and thereby highly stable electric field measurement can be realized even with respect to a variation such as temperature.

Second Embodiment

In a second embodiment, an example in which a measurement electric field is also modulated will be described.

Figure 3:
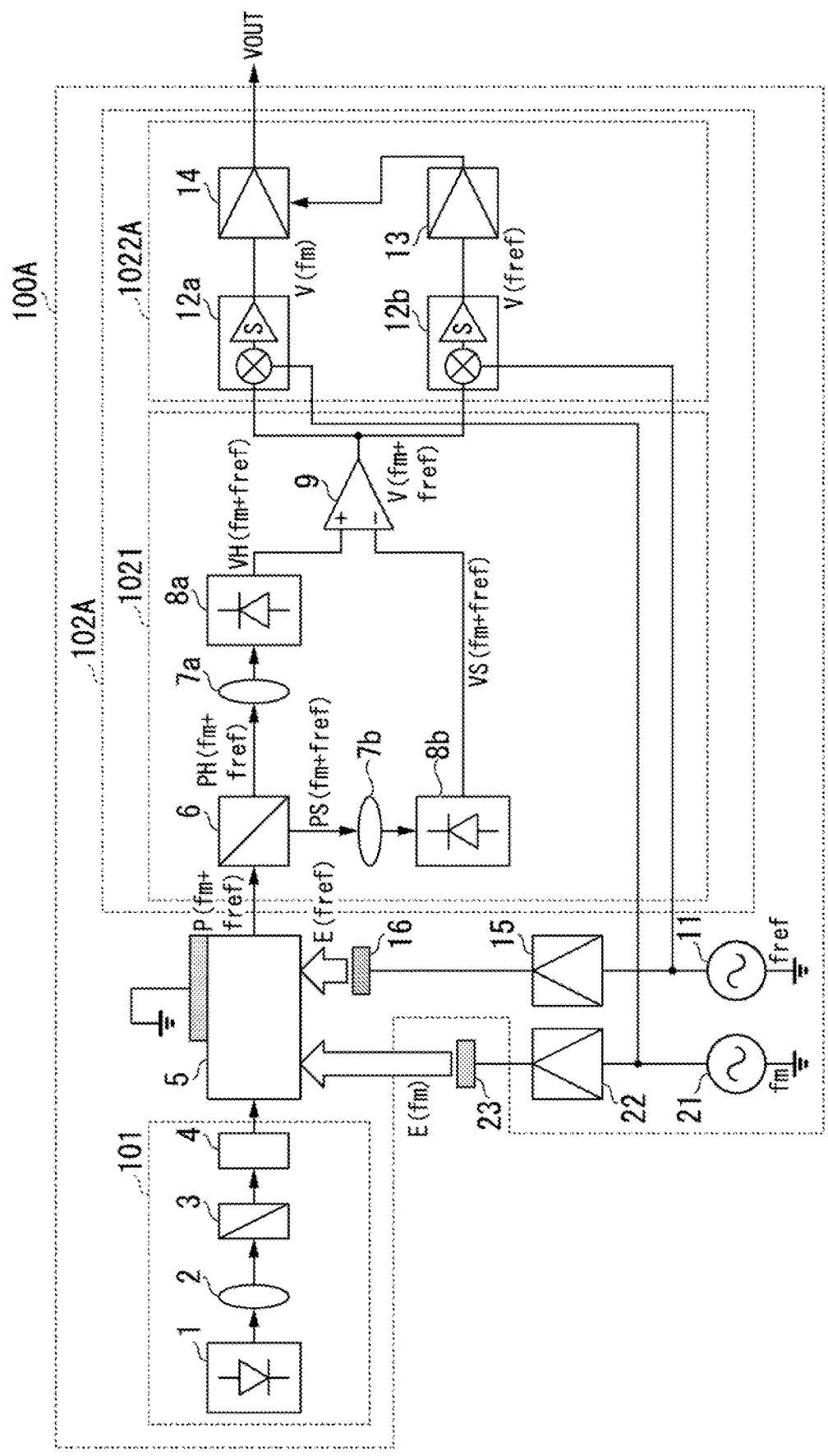
FIG. 3 is a diagram showing a configuration example of an electric field sensor according to a second embodiment.

FIG. 3 is a diagram showing a configuration example of an electric field sensor 100A according to the present embodiment.

As shown in FIG. 3, the electric field sensor 100A includes a light source 1, a lens 2, a polarizer 3, a λ/4 wavelength plate 4, an electro-optic crystal 5, a polarization beam splitter 6, a lens 7a, a lens 7b, a light receiver 8a, a light receiver 8b, a differential amplifier 9, a reference power supply 11 (reference electric field means, reference electric field applicator), a lock-in amplifier 12a (first separator), a lock-in amplifier 12b (second separator), a gain controller 13, a variable gain amplifier 14, an electric field controller 15 (reference electric field means, reference electric field applicator), a reference electric field source 16 (reference electric field means, reference electric field applicator), a measurement power supply 21 (measurement electric field means, measurement electric field applicator), and a measurement electric field controller 22 (measurement electric field means, measurement electric field applicator).

A component 101 on an input side to the electro-optic crystal 5 includes the light source 1, the lens 2, the polarizer 3, and the λ/4 wavelength plate 4.

A component 102A (separation correction means, separation corrector) on an output side of the electro-optic crystal 5 includes the polarization beam splitter 6, the lens 7a, the lens 7b, the light receiver 8a, the light receiver 8b, the differential amplifier 9, the lock-in amplifier 12a, the lock-in amplifier 12b, the gain controller 13, and the variable gain amplifier 14.

The component 102 on the output side of the electro-optic crystal 5 includes a light receiving means 1021 and a separation correction means 1022A.

The light receiving means 1021 includes the polarization beam splitter 6, the lens 7a, the lens 7b, the light receiver 8a, the light receiver 8b, and the differential amplifier 9.

The separation correction means 1022A includes the lock-in amplifier 12a (first amplifier), the lock-in amplifier 12b (second amplifier), the gain controller 13, and the variable gain amplifier 14.

A disposition of optical components of the electric field sensor 100A is the same as that of the electric field sensor 100.

Next, a connection relationship of electrical components of the electric field sensor 100A will be described.

An output terminal of the light receiver 8a is connected to a first input terminal of the differential amplifier 9. An output terminal of the light receiver 8b is connected to a second input terminal of the differential amplifier 9. An output terminal of the differential amplifier 9 is connected to a first input terminal of the lock-in amplifier 12a and a first input terminal of the lock-in amplifier 12b. In the lock-in amplifier 12a, a second input terminal is connected to one end of the measurement power supply 21 and an input terminal of the measurement electric field controller 22, and an output terminal is connected to an input terminal of the variable gain amplifier 14. In the lock-in amplifier 12b, a second input terminal is connected to one end of the reference power supply 11 and an input terminal of the electric field controller 15, and an output terminal is connected to an input terminal of the gain controller 13. The other end of the reference power supply 11 is grounded. An output terminal of the gain controller 13 is connected to a control terminal of the variable gain amplifier 14. An output terminal of the variable gain amplifier 14 is connected to an output of the electric field sensor 100A. The other terminal of the electric field controller 15 is connected to the reference electric field source 16. In the electro-optic crystal 5, the reference electric field source 16 and a measurement electric field source 23 are provided on a first surface side, and a second surface side facing the first surface is grounded. The other end of the measurement power supply 21 is grounded. The other terminal of the measurement electric field controller 22 is connected to the measurement electric field source 23.

Next, an operation of the electric field sensor 100 and each component will be described. Components having the same functions as those in FIG. 1 will be denoted by the same reference signs, and description thereof will be omitted.

The electric field sensor 100A measures an intensity of an electric field generated by a target. In FIG. 3, the measurement electric field source 23 is the target to be measured.

The measurement power supply 21 generates a measurement referential signal fm.

The measurement electric field controller 22 is a driver that drives the measurement referential signal output from the measurement power supply 21 to an electric field intensity, and outputs a drive signal to the measurement electric field source 23.

The measurement electric field source 23 is driven by the drive signal output from the measurement electric field controller 22 and applies a measurement electric field E(fm) to the electro-optic crystal 5. Applying the reference electric field measurement electric field E(fm) to the electro-optic crystal 5 as described above means that the measurement electric field is modulated with the frequency fm.

The differential amplifier 9 amplifies a differential component of electric signals of a P polarized light component and an S polarized light component, and outputs an amplified electric signal V(fm+fref) to the lock-in amplifier 12a and the lock-in amplifier 12b.

The lock-in amplifier 12a extracts a measurement electric field signal component V(fm) from the electric signal output from the differential amplifier 9 using a measurement signal output from the measurement power supply 21.

The lock-in amplifier 12b extracts a reference electric field signal component V(fref) from the electric signal output from the differential amplifier 9 using a reference signal output from the reference power supply 11.

Although improvement in measurement stability is performed by hardware by adjusting a gain in accordance with a variation amount of the reference signal using the variable gain amplifier 14, this may also be calculated and processed by software after outputs of the measurement signal component and the reference signal component are analog/digital (A/D)—converted into numerical values.

When there is capacitive coupling noise from the power supply or noise due to electromagnetic induction or the like in the surroundings in addition to the electric field to be measured, in order to remove these noise components, a referential signal E(fm) is superimposed on the measurement electric field in the present embodiment. Then, also in the present embodiment, only the measurement signal component is detected in the component 102A on the output side of the electro-optic crystal 5. Also in the present embodiment, a level of the measurement signal is corrected by the gain controller 13 and the variable gain amplifier 14 on the basis of a magnitude of the reference signal detected by the lock-in amplifier 12b.

Figure 4:
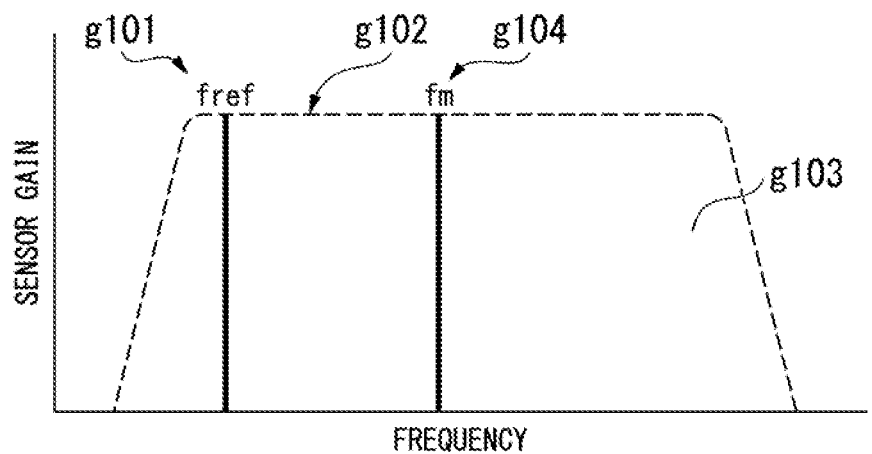
FIG. 4 is a diagram for explaining effects of the electric field sensor according to the second embodiment.

FIG. 4 is a diagram for explaining effects of the electric field sensor 100A according to the present embodiment. In FIG. 4, the horizontal axis represents a frequency and the vertical axis represents a sensor gain of the electric field sensor 100A. Reference sign g101 indicates a frequency fref of the reference signal, reference sign g102 indicates frequency characteristics of the electric field sensor 100A, and reference sign g103 indicates measurement frequency characteristics. Reference sign g104 indicates a reference frequency for measurement. As shown in FIG. 4, the frequency fref of the reference signal is different from the reference frequency for measurement.

Thereby, the electric field sensor 100A of the present embodiment can obtain the same effects as those of the electric field sensor 100 of the first embodiment. Further, according to the present embodiment, when there is capacitive coupling noise from the power supply or noise due to electromagnetic induction or the like, these noise components can be removed. Therefore, according to the present embodiment, a signal-to-noise ratio (SN ratio) can be further improved as compared with that in the first embodiment.

First Example

An example in which the electric field sensor 100A of the second embodiment is applied to measurement of a generated electric field distribution of a solar cell will be described.

Figure 5:
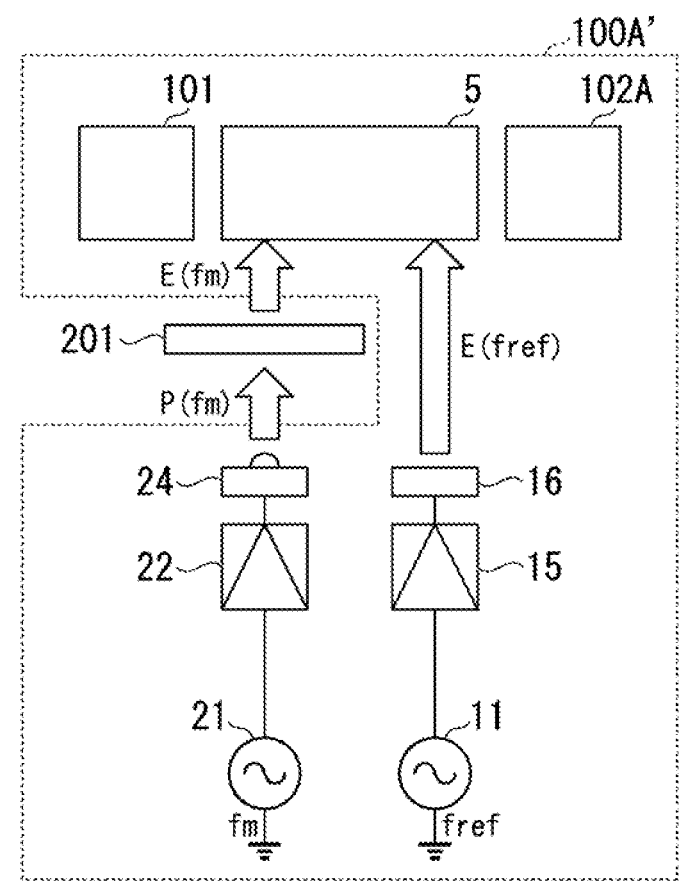
FIG. 5 is a diagram showing a configuration example when the electric field sensor of the second embodiment is applied to measurement of a generated electric field distribution of a solar cell.

FIG. 5 is a diagram showing a configuration example when the electric field sensor 100A of the second embodiment is applied to measurement of a generated electric field distribution of a solar cell.

As shown in FIG. 5, the electric field sensor 100A includes the component 101 on an input side to the electro-optic crystal 5 (FIG. 3), the component 102A on an output side of the electro-optic crystal 5 (FIG. 3), the reference power supply 11, the electric field controller 15, the reference electric field source 16, the measurement electric field controller 22 (measurement electric field means, measurement electric field applicator), the measurement power supply 21 (measurement electric field means, measurement electric field applicator), and a solar cell irradiation light source 24 (measurement electric field means, measurement electric field applicator).

A solar cell 201 is a target to be measured.

An electric field sensor 100A' measures an intensity of an electric field generated by the solar cell 201 which is a target.

A connection of the electric field sensor 100A' that is different from the connection of the electric field sensor 100A will be described.

The other terminal of the measurement electric field controller 22 is connected to the solar cell irradiation light source 24.

Next, an operation of the electric field sensor 100A' that is different from the operation of the electric field sensor 100A will be described.

The measurement power supply 21 generates the measurement referential signal fm.

The measurement electric field controller 22 is a driver that drives the measurement referential signal output from the measurement power supply 21 to an electric field intensity and outputs a drive signal to the solar cell irradiation light source 24.

The solar cell irradiation light source 24 is a light source for causing the solar cell 201 to generate electricity. The solar cell irradiation light source 24 is driven by the drive signal output from the measurement electric field controller 22, and irradiates the solar cell 201 with a light beam P(fm) modulated by the measurement referential signal fm.

The solar cell 201 is irradiated with light for power generation modulated by the measurement referential signal at a frequency fm. The solar cell 201 generates an electric field E(fm) using the irradiated light.

The electric field sensor 100A' provides the electric field E(fm) generated by the solar cell 201 to the electro-optic crystal 5. Then, a reference electric field E(ref) modulated by the reference signal at the frequency fref is applied to the electro-optic crystal 5.

That is, in the electric field sensor 100A', the electric field E(fm) generated by the solar cell 201 instead of the measurement electric field source 23 in the electric field sensor 100A of FIG. 3 is applied to the electro-optic crystal 5. The electric field sensor 100A' measures the electric field E(fm) generated by the solar cell 201.

Also in the present example, as in the second embodiment, when a gain of the variable gain amplifier 14 (FIG. 3)

is actively adjusted to a gain that corrects a variation of the electro-optic constant $r_{eff}$, an electric field sensitivity of the electric field sensor 100A' can be corrected by the reference power supply 11 of the electric field sensor 100A' even when an ambient temperature changes, and thereby highly stable electric field measurement can be realized even with respect to a variation such as temperature. Thereby, according to the present example, highly stable measurement is possible.

Second Example

An example applied to an electric field sensor of a waveguide type will be described based on the electric field sensor 100 of the first embodiment. As for a configuration example and an operation example of the electric field sensor of a waveguide type, see, for example, Non-Patent Literature 3.

Figure 6:
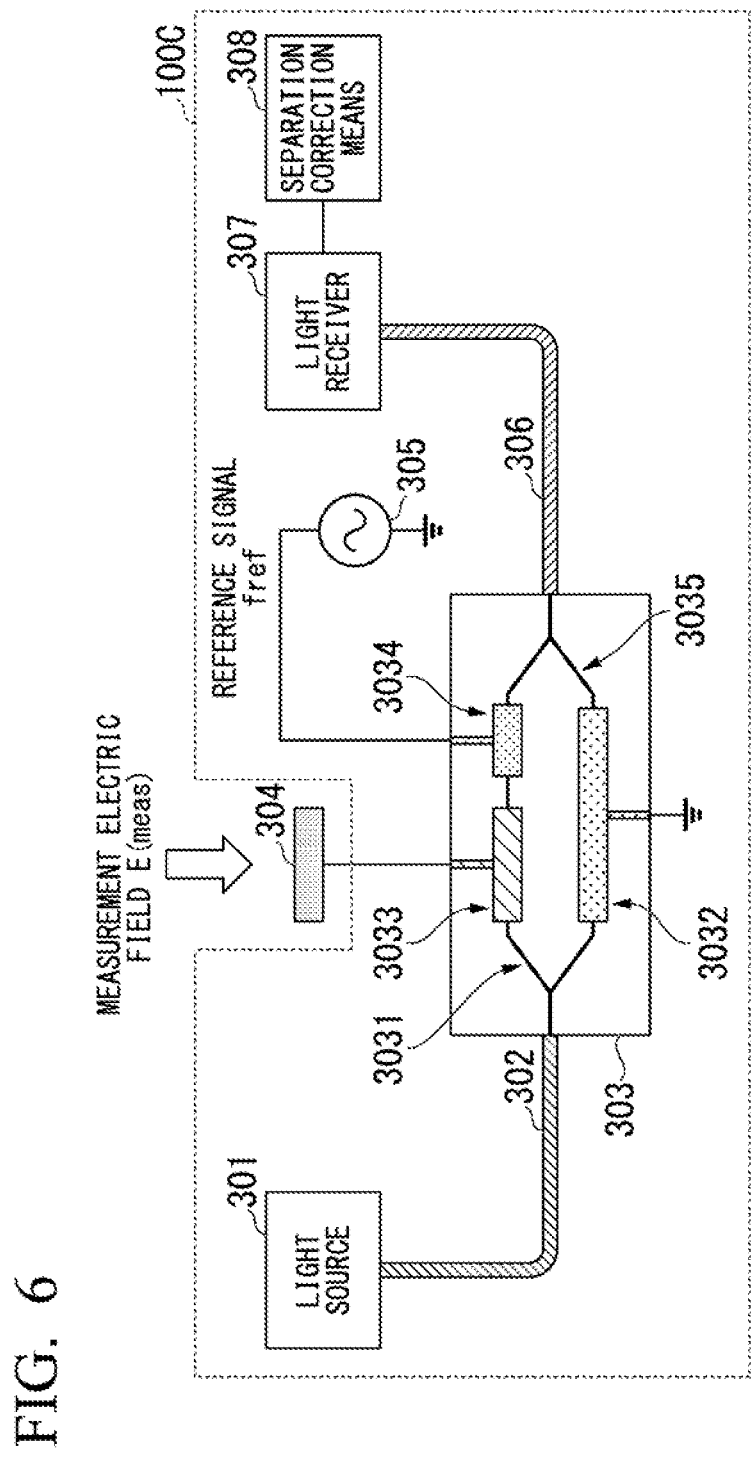
FIG. 6 is a diagram showing a configuration example when the electric field sensor of the first embodiment is applied to an electric field sensor of a waveguide type.

FIG. 6 is a diagram showing a configuration example when the electric field sensor 100 of the first embodiment is applied to the electric field sensor of a waveguide type.

As shown in FIG. 6, an electric field sensor 100C includes a light source 301, an optical fiber 302, an electro-optic crystal 303, a reference power supply 305, an optical fiber 306, a light receiver 307, and a separation correction means 308.

The electro-optic crystal 303 includes a first optical waveguide 3031, an electrode 3032 (third electrode), an electrode 3033 (first electrode), an electrode 3034 (second electrode), and a second optical waveguide 3035.

One end of the optical fiber 302 is connected to the light source 301.

The other end of the optical fiber 302 is connected to an input terminal of the first optical waveguide 3031 of the electro-optic crystal 303. The optical fiber 302 is connected to the first optical waveguide 3031 of the electro-optic crystal 303 via a photocoupler.

The first optical waveguide 3031 is formed in a Y shape and includes one input terminal and two output terminals (a first output terminal and a second output terminal). In the first optical waveguide 3031, the first output terminal is connected to an input terminal of the electrode 3032, and the second output terminal is connected to an input terminal of the electrode 3033.

In the electrode 3032, a connection part to the outside is grounded, and an output terminal is connected to a first input terminal of the second optical waveguide 3035.

In the electrode 3033, a connection part to the outside is connected to a measurement electric field source 304, and an output terminal is connected to an input terminal of the electrode 3034.

In the electrode 3034, a connection part to the outside is connected to one end of the reference power supply 305, and an output terminal is connected to a second input terminal of the second optical waveguide 3035.

The second optical waveguide 3035 is formed in a Y shape and includes two input terminals (a first output terminal and a second output terminal) and one output terminal. The output terminal of the second optical waveguide 3035 is connected to an input end of the optical fiber 306.

The other end of the optical fiber 306 is connected to the light receiver 307. The optical fiber 306 is connected to the second optical waveguide 3035 of the electro-optic crystal 303.

A light beam incident on the optical fiber 302 from the light source 301 is a light beam of linearly polarized light.

The measurement electric field source 304 applies a measurement electric field E(meas) to the electrode 3033 to apply the measurement electric field E(meas) to the electro-optic crystal 303.

The reference power supply 305 generates a reference signal fref for creating a reference electric field signal component and applies it to the electrode 3034 to apply the reference signal fref to the electro-optic crystal 303.

A configuration emitted from the electro-optic crystal 303 to the optical fiber 306 is also linearly polarized light.

The light receiver 307 receives the light emitted from the electro-optic crystal 303 via the optical fiber 306 and converts the received light into an electric signal.

The electric field sensor 100C measures an intensity of an electric field generated by a target. In FIG. 6, the measurement electric field source 304 is the target to be measured.

The separation correction means 308 detects a measurement signal and a reference signal from the electric signal output from the light receiver 307. The separation correction means 308 corrects a signal level of the measurement signal on the basis of a signal level of the detected reference signal. The separation correction means 308 may be constituted by, for example, the filter 10 (first separator), the lock-in amplifier 12 (second separator), the gain controller 13, and the variable gain amplifier 14 as in FIG. 1. Alternatively, the separation correction means 308 may be a central processing unit (CPU), and may also be one in which outputs of the measurement signal component and the reference signal component are A/D-converted into numerical values, and then calculated and processed by software.

As shown in FIG. 6, the second example is one in which the barrack-type electro-optic crystal of FIG. 1 is configured in the electric field sensor of an optical waveguide-type. The light source 301 corresponds to the light source 1 (FIG. 1), the measurement electric field source 304 corresponds to the measurement electric field source 23, and the reference power supply 305 corresponds to the reference power supply 11.

In the configuration shown in FIG. 6, a signal component passing through the electrode 3032 is not affected by the electric field. On the other hand, a phase of a signal component passing through the electrode 3033 and the electrode 3034 changes due to a change in the measurement electric field E(meas). The second optical waveguide 3035 mixes the signal component passing through the electrode 3032 with the signal component passing through the electrode 3033 and the electrode 3034. The light receiver 307 receives such a signal and obtains a phase change from the received signal on the basis of the reference signal. Also in this configuration, a gain of the extracted signal is controlled by the gain controller 13 (FIG. 1) as in the electric field sensor 100 (FIG. 1) on the basis of the obtained phase change, and thereby an influence due to a temperature variation can be corrected. The electric field sensor 100C converts the signal received by the light receiver 307 into an electric signal and extracts the measurement signal component V(meas) from the converted electric signal using the filter 10 (FIG. 1). Then, in the electric field sensor 100C, the reference signal V(fref) is detected by the lock-in amplifier 12 (FIG. 1), and the variable gain amplifier 14 (FIG. 1) is controlled by the gain controller 13 (FIG. 1) using the detected reference signal V(fref).

Also in the electric field sensor configured as shown in FIG. 6, a phase change of the electro-optic crystal 303 is temperature dependent. For such a temperature dependence, in the second example shown in FIG. 6, components (the reference power supply 305 and the electrode 3034) for applying the reference electric field are provided to monitor the phase change with respect to the temperature change. Then, also in the second embodiment, the light receiver 307 monitors a phase change with respect to a temperature change, and an arithmetic device (not shown) corrects an intensity of the measurement signal according to a variation amount, and thereby electric field can be measured with high measurement stability even when an ambient temperature or the like changes.

Third Example

Next, an example in which the electric field sensor of the present embodiment is applied to a vertical electric field sensor will be described. As for a configuration example and an operation example of the vertical electric field sensor, see, for example, Non-Patent Literature 4.

Figure 7:
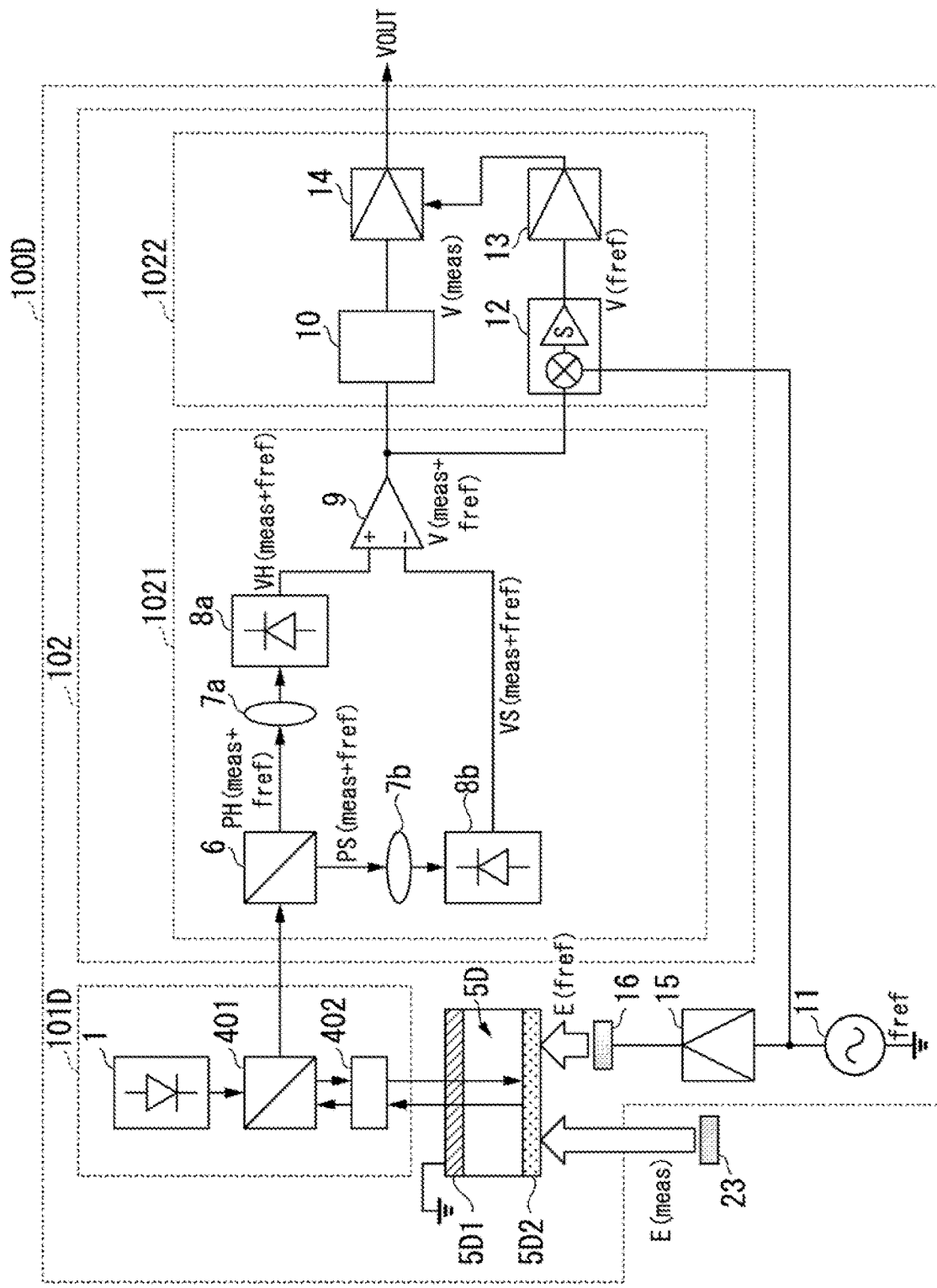
FIG. 7 is a diagram showing a configuration example in which the electric field sensor of the present embodiment is applied to a vertical electric field sensor.
Figure 8:
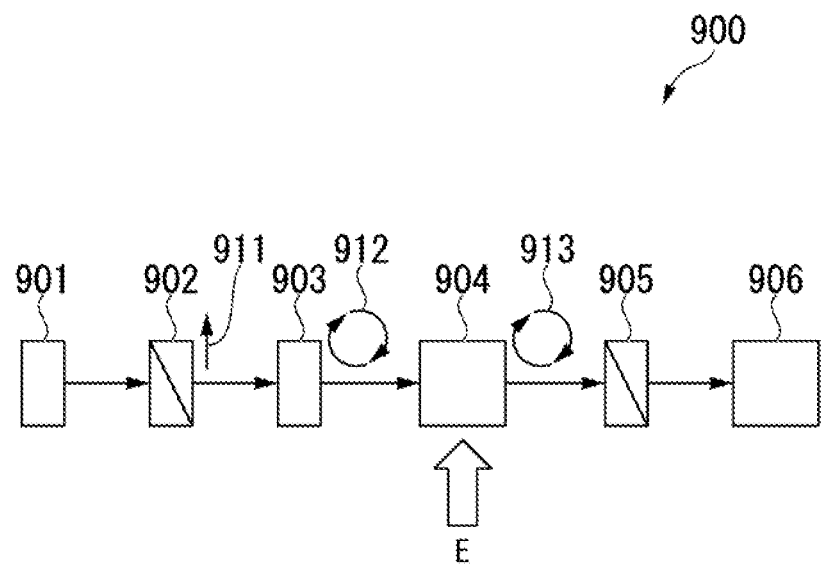
FIG. 8 is a diagram showing a configuration example of a conventional electric field sensor utilizing an electro-optic effect.
Figure 9:
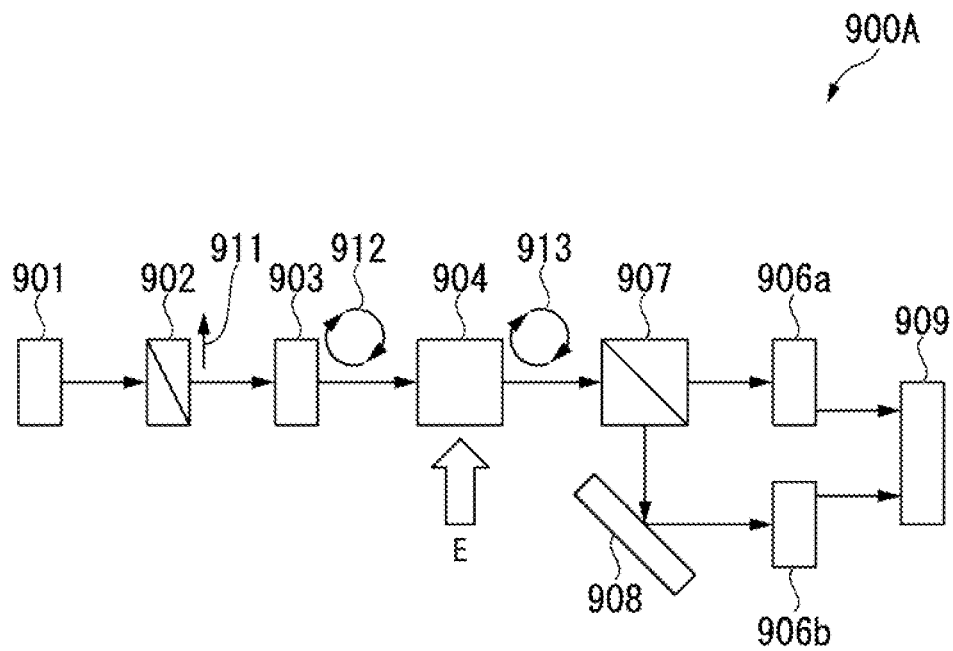
FIG. 9 is a diagram showing a configuration example in which a polarization beam splitter is disposed instead of an analyzer (polarizer) after an output of an electro-optic crystal.

FIG. 7 is a diagram showing a configuration example in which the electric field sensor of the present embodiment is applied to the vertical electric field sensor.

The example of FIG. 7 is an example in which the electric field sensor of the first embodiment is applied to the vertical electric field sensor. The electric field sensor of the second embodiment can also be used as a vertical electric field sensor as a matter of course.

As shown in FIG. 7, an electric field sensor 100D includes the light source 1, a beam splitter 401, a λ/4 wavelength plate 402, an electro-optic crystal 5D, the polarization beam splitter 6, the lens 7a, the lens 7b, the light receiver 8a, the light receiver 8b, the differential amplifier 9, the filter 10 (first separator), the reference power supply 11 (reference electric field means, reference electric field applicator), the lock-in amplifier 12 (second separator), the gain controller 13, the variable gain amplifier 14, the electric field controller 15 (reference electric field means, reference electric field applicator), and the reference electric field source 16 (reference electric field means, reference electric field applicator).

A component 101D on an input side to the electro-optic crystal 5D includes the light source 1, the beam splitter 401, and the λ/4 wavelength plate 402.

The component 102 (separation correction means, separation corrector) on an output side from the electro-optic crystal 5D includes the polarization beam splitter 6, the lens 7a, the lens 7b, the light receiver 8a, the light receiver 8b, the differential amplifier 9, the filter 10, the lock-in amplifier 12, the gain controller 13, and the variable gain amplifier 14.

The component 102 on the output side of the electro-optic crystal 5D includes the light receiving means 1021 and the separation correction means 1022.

In the electro-optic crystal 5D, an indium tin oxide (ITO) electrode 5D1 is grounded. The ITO electrode 5D1 is a transparent electrode. The electro-optic crystal 5D includes a mirror 5D2 provided on a second surface facing a first surface on which the ITO electrode 5D1 is disposed. The electro-optic crystal 5 emits the light beam P (meas+fref) of circularly polarized light whose polarization state has changed due to a change in birefringence according to the reference electric field E(fref) and the measurement electric field E(meas). The electro-optic crystal 5D is, for example, $LiNbO_3$, $LiTaO_3$, $Bi_{12}SiO_{20}$ (BSO), $Bi_{12}GeO_{20}$ (BGO), ADP, KDP, a crystal, or the like.

Components having the same functions as those of the electric field sensor 100 will be denoted by the same reference signs, and description thereof will be omitted.

A disposition of the components of the electric field sensor 100D different from the disposition of the electric field sensor 100 will be described.

The beam splitter 401 is disposed between the light source 1 and the λ/4 wavelength plate 402. The λ/4 wavelength plate 402 is disposed between the beam splitter 401 and the electro-optic crystal 5.

In the electro-optic crystal 5, the surface having the grounded ITO electrode 5D1 is disposed on a side facing the λ/4 wavelength plate 402, and the surface having the mirror 5D2 is disposed on a side facing the reference electric field source 16 and the measurement electric field source 23.

The electric field sensor 100D measures an intensity of an electric field generated by a target. In FIG. 7, the measurement electric field source 23 is the target to be measured.

The beam splitter 401 divides a light beam emitted by the light source 1 into two, emits one light beam to the polarization beam splitter 6, and emits the other light beam to the λ/4 wavelength plate 402. The light beam that has been emitted to the λ/4 wavelength plate 402 is reflected by the mirror 5D2 of the electro-optic crystal 5D, passes through the λ/4 wavelength plate 402, and is incident on the beam splitter 401. Therefore, the light beam emitted to the polarization beam splitter 6 by the beam splitter 401 also includes the light beam of the light source 1 that has passed through the λ/4 wavelength plate 402, has passed through the electro-optic crystal 5D, has been reflected by the mirror 5D2, and has passed through the λ/4 wavelength plate 402 in addition to the light beam that has been divided from the light source 1.

The λ/4 wavelength plate 402 gives a phase difference of λ/4 to a wavelength of the light beam incident from the beam splitter 401 and causes a phase difference of λ/4 in a wavelength of the light beam that has passed through the electro-optic crystal 5D and has been reflected by the mirror 5D2.

In the configuration shown in FIG. 7, a phase change occurs with respect to an electric field (reference electric field, measurement electric field) applied to the ITO electrode 5D1 and a lower surface of the electro-optic crystal 5D. The electric field sensor 100D measures an electric field intensity by acquiring a phase change of light when the light beam is reflected by the mirror 5D2 and returned through the ITO electrode 5D1.

Thus, also in the present example, it is possible to cope with a temperature change by applying the reference electric field from the reference electric field source 16 that generates the reference electric field.

Although an example based on the configuration of the electric field sensor 100 shown in FIG. 1 has been described in the configuration shown in FIG. 7, the configuration may also be based on the configuration of the electric field sensor 100A shown in FIG. 3. In this case, the measurement referential signal may be supplied to the measurement electric field source 23 (FIG. 3) via the measurement electric field controller 22 (FIG. 3). Then, a configuration of the separation correction means 1022 is the same as that of the separation correction means 1022A (FIG. 3).

REFERENCE SIGNS LIST 100, 100A, 100A', 100C, 100D Electric field sensor
1 Light source
2 Lens
3 Polarizer
4 λ/4 wavelength plate
5, 5D Electro-optic crystal 6 Polarization beam splitter
7a Lens
7b Lens
8a Light receiver
8b Light receiver
9 Differential amplifier
10 Filter
11 Reference power supply
12, 12a, 12b Lock-in amplifier
13 Gain controller
14 Variable gain amplifier
15 Electric field controller
16 Reference electric field source
21 Measurement power supply
22 Measurement electric field controller
23 Measurement electric field source
24 Solar cell irradiation light source
301 Light source
302 Optical fiber
303 Electro-optic crystal
304 Measurement electric field source
305 Reference power supply
306 Optical fiber
307 Light receiver
101, 101D Component on input side to electro-optic crystal
102, 102A Component on output side of electro-optic crystal
401 Beam splitter
402 λ/4 wavelength plate
3031 First optical waveguide
3032 Electrode 3032
3033 Electrode
3034 Electrode
3035 Second optical waveguide

The invention claimed is:

1. An electric field sensor which measures an electric field generated by a target utilizing an electro-optic effect, the electric field sensor comprising:
    a light source;
    an electro-optic crystal on which light in a predetermined polarization state emitted from the light source is incident and which is subjected to the electric field generated by the target;
    a reference electric field applicator configured to apply an electric field based on a reference signal with a known signal level to the electro-optic crystal;
    a light receiver configured to receive light emitted from the electro-optic crystal and to convert the received light into an electric signal; and
    a separation corrector configured to separate the electric signal into a measurement signal based on the electric field generated by the target and the reference signal and to correct a signal level of the measurement signal on the basis of the signal level of the separated reference signal,
    wherein the light receiver comprises:
    a polarization beam splitter configured to separate circularly polarized light emitted from the electro-optic crystal into P-polarized light and S-polarized light; and
    a differential amplifier configured to amplify a differential component of electric signals of the P-polarized light and the S-polarized light separated by the polarization beam splitter and to output the amplified electric signal to the separation corrector, and
    wherein the separation corrector comprises:
    a filter configured to remove a signal component of the electric field based on the reference signal in the electric signal output from the differential amplifier;
    an amplifier configured to extract a signal component of the electric field based on the reference signal in the electric signal output from the differential amplifier using the reference signal;
    a gain controller configured to generate a control signal that controls an amplification factor according to the signal component of the electric field based on the reference signal output from the amplifier; and
    a variable gain amplifier configured to vary an amplification factor of the electric signal output from the filter in which the signal component of the electric field based on the reference signal is removed according to the control signal output from the gain controller, and to output the electric signal.

2. The electric field sensor according to claim 1, wherein the separation corrector comprises:
    a first separator configured to separate the measurement signal from the electric signal;
    a second separator configured to separate the reference signal from the electric signal; and
    a corrector configured to correct the signal level of the measurement signal on the basis of the signal level of the separated reference signal.

3. The electric field sensor according to claim 1, further comprising:
    a measurement electric field applicator configured to apply a referential signal with a known signal level to the target,
    wherein the separation corrector comprises:
    a first separator configured to separate the measurement signal, on which the referential signal is superimposed, from the electric signal;
    a second separator configured to separate the reference signal from the electric signal; and
    a corrector configured to correct the signal level of the measurement signal on the basis of the signal level of the separated reference signal.

4. The electric field sensor according to claim 3, wherein the target is a solar cell,
    the light source is configured to irradiate the solar cell with light, and
    the electro-optic crystal is subjected to an electric field generated by the solar cell irradiated with the light from the light source as the electric field generated by the target.

5. The electric field sensor according to claim 1, wherein the electro-optic crystal comprises:
    a first optical waveguide on which light of the light source is incident;
    a first electrode which is connected to a first output of the first optical waveguide and to which the electric field generated by the target is input;
    a second electrode which is connected to the first electrode and to which the electric field based on the reference signal is applied;
    a third electrode which is connected to the first output of the first optical waveguide and grounded; and
    a second optical waveguide having a first input to which the second electrode is connected, a second input to which the third electrode is connected, and an output connected to the light receiver.

6. The electric field sensor according to claim 1, wherein the predetermined polarization state is circularly polarized light.

7. The electric field sensor according to claim 1, wherein a frequency of the reference signal is in a frequency band that does not affect the measurement signal.

8. An electric field sensor which measures an electric field generated by a target utilizing an electro-optic effect, the electric field sensor comprising:
- a light source;
- an electro-optic crystal on which light in a predetermined polarization state emitted from the light source is incident and which is subjected to the electric field generated by the target;
- a reference electric field applicator configured to apply an electric field based on a reference signal with a known signal level to the electro-optic crystal;
- a light receiver configured to receive light emitted from the electro-optic crystal and to convert the received light into an electric signal;
- a separation corrector configured to separate the electric signal into a measurement signal based on the electric field generated by the target and the reference signal and to correct a signal level of the measurement signal on the basis of the signal level of the separated reference signal; and
- a measurement electric field applicator configured to apply a referential signal with a known signal level to the target,
- wherein the light receiver comprises:
- a polarization beam splitter configured to separate circularly polarized light emitted from the electro-optic crystal into P-polarized light and S-polarized light; and
- a differential amplifier configured to amplify a differential component of electric signals of the P-polarized light and the S-polarized light separated by the polarization beam splitter and to output the amplified electric signal to the separation corrector, and
- wherein the separation corrector comprises:
- a first amplifier configured to extract a signal component of an electric field based on the measurement signal in the electric signal output from the differential amplifier using the measurement signal;
- a second amplifier configured to extract a signal component of an electric field based on the reference signal in the electric signal output from the differential amplifier using the reference signal;
- a gain controller configured to generate a control signal that controls an amplification factor according to a signal component of the electric field based on the reference signal output from the second amplifier; and
- a variable gain amplifier configured to vary an amplification factor of the electric signal of the signal component of the electric field based on the measurement signal output from the first amplifier according to the control signal output from the gain controller, and to output the electric signal.

9. An electric field sensor which measures an electric field generated by a target utilizing an electro-optic effect, the electric field sensor comprising:
- a light source;
- an electro-optic crystal on which light in a predetermined polarization state emitted from the light source is incident and which is subjected to the electric field generated by the target;
- a reference electric field applicator configured to apply an electric field based on a reference signal with a known signal level to the electro-optic crystal;
- a light receiver configured to receive light emitted from the electro-optic crystal and to convert the received light into an electric signal;
- a separation corrector configured to separate the electric signal into a measurement signal based on the electric field generated by the target and the reference signal and to correct a signal level of the measurement signal on the basis of the signal level of the separated reference signal;
- a transparent electrode disposed on a first surface of the electro-optic crystal; and
- a mirror disposed on a second surface of the electro-optic crystal facing the first surface,
- wherein light emitted from the light source is incident from the transparent electrode, the light incident from the transparent electrode is reflected by the mirror, and the reflected light is emitted from the transparent electrode,
- wherein the separation corrector is configured to measure the electric field generated by the target by acquiring a phase change of light that has been emitted by the light source, reflected by the mirror, and returned through the transparent electrode,
- wherein the light receiver comprises:
- a polarization beam splitter configured to separate circularly polarized light emitted from the electro-optic crystal into P-polarized light and S-polarized light; and
- a differential amplifier configured to amplify a differential component of electric signals of the P-polarized light and the S-polarized light separated by the polarization beam splitter and to output the amplified electric signal to the separation corrector, and
- wherein the separation corrector comprises:
- a filter configured to remove a signal component of the electric field based on the reference signal in the electric signal output from the differential amplifier;
- an amplifier configured to extract a signal component of the electric field based on the reference signal in the electric signal output from the differential amplifier using the reference signal;
- a gain controller configured to generate a control signal that controls an amplification factor according to the signal component of the electric field based on the reference signal output from the amplifier; and
- a variable gain amplifier configured to vary an amplification factor of the electric signal output from the filter in which the signal component of the electric field based on the reference signal is removed according to the control signal output from the gain controller, and to output the electric signal.

* * * * *